United States Patent
Buehler et al.

(10) Patent No.: US 7,962,881 B2
(45) Date of Patent: Jun. 14, 2011

(54) VIA STRUCTURE TO IMPROVE ROUTING OF WIRES WITHIN AN INTEGRATED CIRCUIT

(75) Inventors: Markus T. Buehler, Weil im Schoenbuch (DE); Ankit Gangwar, Pradesh (IN); Juergen Koehl, Weil im Schoenbuch (DE); Arun K. Mishra, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 12/181,374

(22) Filed: Jul. 29, 2008

(65) Prior Publication Data

US 2010/0031220 A1 Feb. 4, 2010

(51) Int. Cl.
*G06F 17/50* (2006.01)

(52) U.S. Cl. .................. 716/126; 716/112; 716/135

(58) Field of Classification Search .................. 716/112, 716/126, 135
See application file for complete search history.

(56) References Cited

U.S. PATENT DOCUMENTS

| | | | | |
|---|---|---|---|---|
| 4,613,941 A * | 9/1986 | Smith et al. | ...................... | 716/12 |
| 5,068,603 A * | 11/1991 | Mahoney | ...................... | 714/726 |
| 6,026,224 A * | 2/2000 | Darden et al. | ................... | 716/10 |
| 6,686,768 B2 * | 2/2004 | Comer | ........................... | 326/38 |
| 6,880,143 B1 * | 4/2005 | Yu | ....................... | 716/8 |
| 6,938,234 B1 * | 8/2005 | Teig et al. | ......................... | 716/12 |
| 7,003,748 B1 * | 2/2006 | Hsu | ....................... | 716/8 |
| 7,080,329 B1 | 7/2006 | Teig et al. | | |
| 7,272,803 B1 * | 9/2007 | Hsu | ....................... | 716/2 |
| 7,308,669 B2 * | 12/2007 | Buehler et al. | .................... | 716/13 |
| 7,614,024 B2 * | 11/2009 | Bothra | ............................. | 716/10 |
| 7,624,367 B2 * | 11/2009 | Frankle et al. | .................... | 716/12 |
| 7,634,751 B2 * | 12/2009 | Ueda | ............................... | 716/12 |
| 7,689,960 B2 * | 3/2010 | Park et al. | ......................... | 716/8 |
| 2006/0048088 A1 * | 3/2006 | Nakano | ............................ | 716/12 |
| 2006/0265684 A1 * | 11/2006 | Buehler et al. | .................... | 716/12 |
| 2007/0262454 A1 * | 11/2007 | Shibata | ........................... | 257/758 |
| 2007/0294657 A1 * | 12/2007 | Hsu | ....................... | 716/13 |
| 2008/0111158 A1 * | 5/2008 | Sherlekar et al. | .............. | 257/207 |

OTHER PUBLICATIONS

Sai-Halasz, George A., Performance Trends in High-End Processors; Proceedings of the IEEE, vol. 83; Jan. 1995; No. 1; pp. 20-36.

* cited by examiner

*Primary Examiner* — Naum Levin
(74) *Attorney, Agent, or Firm* — Cantor Colburn LLP; Yuanmin Cai

(57) ABSTRACT

In consideration for the fact that a connection on the upper layers of an integrated circuit needs to access a lower layer to connect to, e.g., a transistor, at least one via on each layer is required below the top layer used by a connection for each pin. The vias (i.e., the connection structures between wiring planes within an integrated circuit) are arranged such that the number of wiring resources blocked on the lower layers is reduced. Various rules govern which vias are chosen. The main characteristic is to elect only a certain number of wiring channels appropriate for the vias on a single layer and then apply an optimization within the restricted elected wiring channels on that layer to select the most appropriate vias.

21 Claims, 6 Drawing Sheets

VIA STRUCTURE TO IMPROVE ROUTING OF WIRES WITHIN AN INTEGRATED CIRCUIT

BACKGROUND

The present invention relates generally to integrated circuits, and, more particularly, to a multiple layer integrated circuit having a via structure to improve the routing of the wires within the integrated circuit.

In the field of semiconductor integrated circuits ("ICs"), it is now accepted practice that even though the number of metal layers increases with each technology node, for most designs the silicon density is limited by the amount of available routing resources. Increasing the number of metal layers further will have limited benefit, as all wires to be routed on an upper layer need to pass through a lower layer using a via structure (i.e., a connection structure between wiring planes within an IC), and hence these wires may block via and wiring channels on these layers.

BRIEF SUMMARY

According to an embodiment of the invention, in consideration for the fact that a connection on the upper layers of an integrated circuit needs to access a lower layer to connect to, e.g., a transistor, at least one via on each layer is required below the top layer used by a connection for each pin. The vias are arranged such that the number of wiring resources blocked on the lower layers is reduced. Various rules govern which vias are chosen. The main characteristic is to elect only a certain number of wiring channels appropriate for the vias on a single layer and then apply an optimization within the restricted elected wiring channels on that layer to select the most appropriate vias.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1:
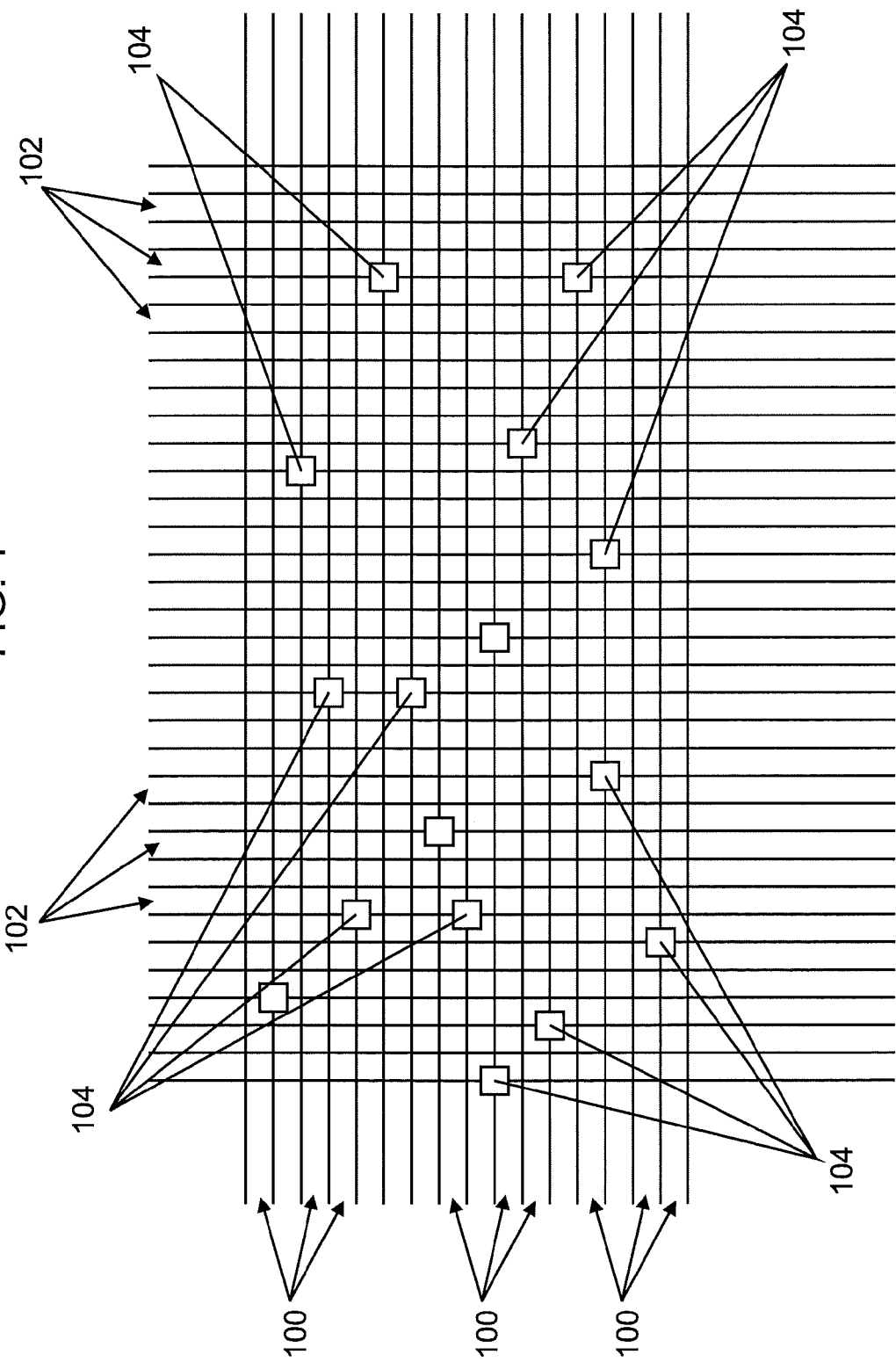
FIGS. 1-3 illustrate an embodiment of the invention in which certain randomly placed vias are moved no more than two wiring channels to increase the number of available wiring channels.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer-usable or computer-readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer-usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2:
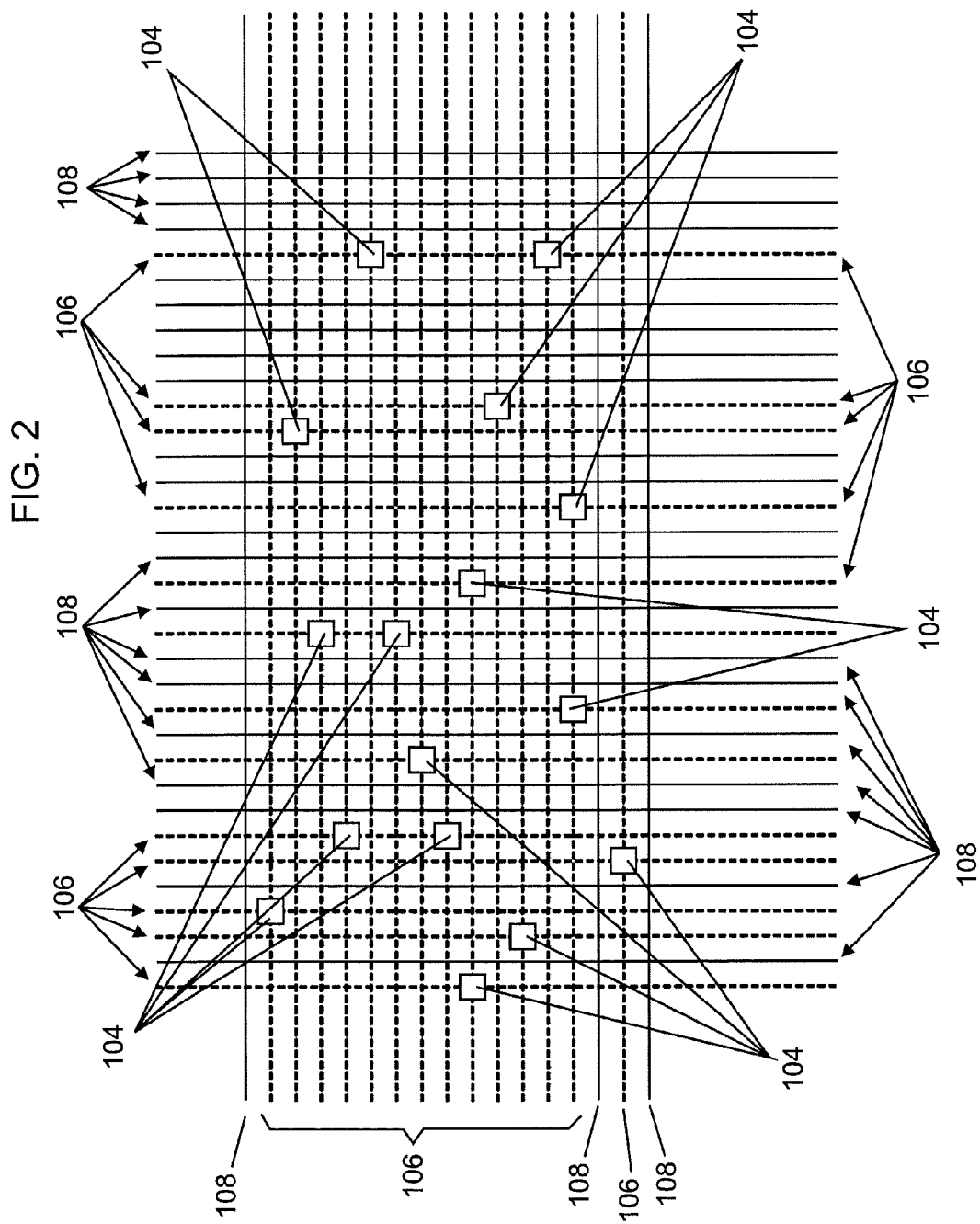
Figure 3:
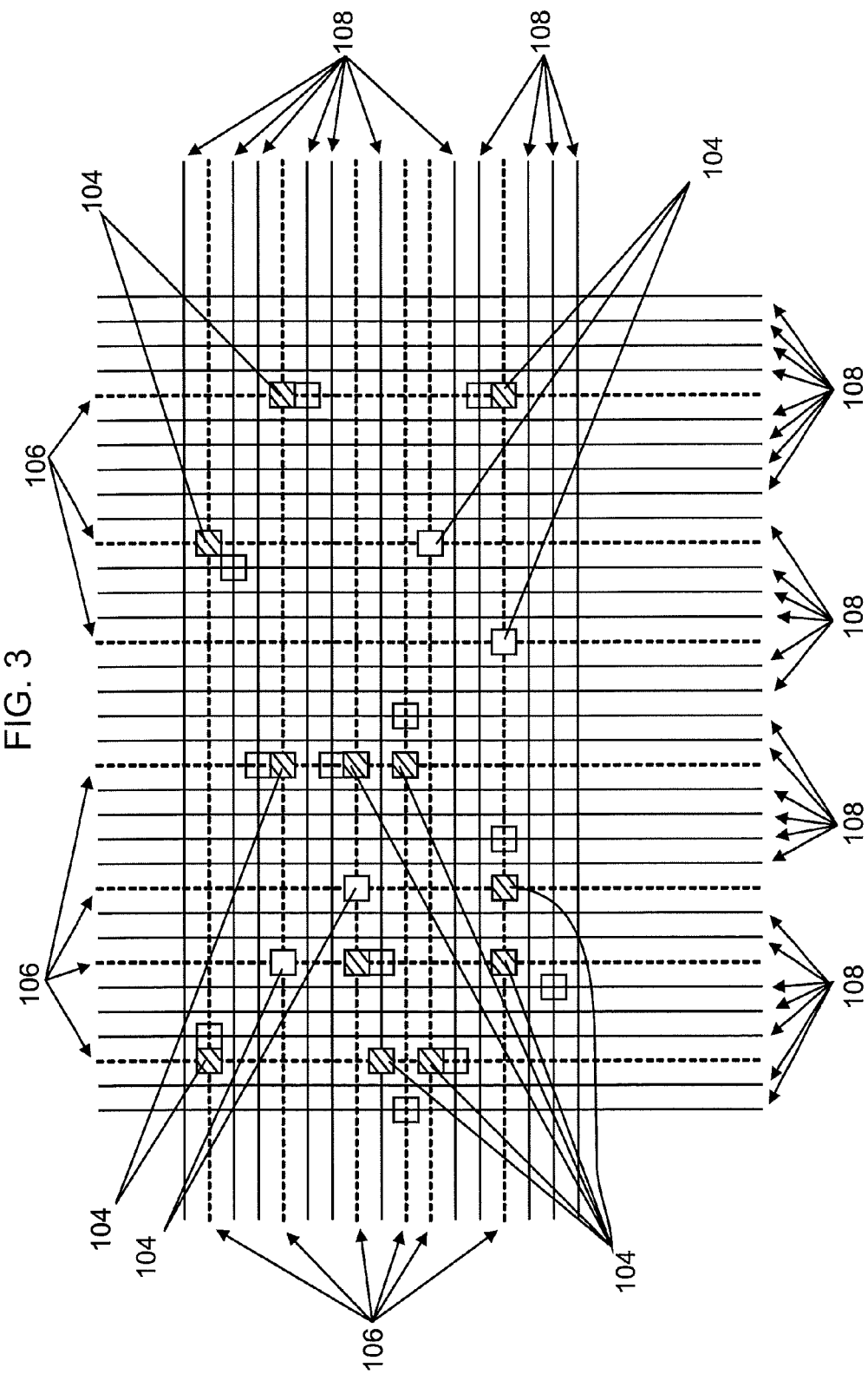

Referring to FIGS. 1-3, there illustrated is an embodiment of the invention. More specifically, FIGS. 1-3 illustrate how the number of blocked wiring channels can be reduced (and how the number of available wiring channels may be increased) by, e.g., approximately 50%, by allowing randomly placed vias to be moved by a single wiring channel or by a maximum of two wiring channels in accordance with an embodiment of the invention. The areas within the integrated circuit wiring where vias are allowed by an embodiment of the invention are limited such that the routing of wires (i.e., the "wirability") on the intermediate layers is improved. Several heuristics in accordance with embodiments of the invention are described herein to limit the area allowed for via placement such that the number of blocked wiring channels is reduced and the number of available wiring channels is correspondingly increased.

In FIG. 1, the horizontal lines 100 drawn as shown represent a first layer of wires in an integrated circuit. The vertical lines 102 drawn as shown represent a second layer of wires in the integrated circuit. In an embodiment of the invention, the first layer of wires 100 may be located higher vertically than the second layer of wires 102, or vice versa. The squares 104 represent vias or vertical interconnects such that each via connects together a specific pair of wires, one in each layer 102-104. A total of 16 vias 104 are illustrated in FIG. 1. The vias 104 are placed randomly in FIG. 1.

In FIG. 2, the dotted lines 106 for both the first and second layers 100-102 of wires indicate the horizontal and vertical wiring channels that are blocked by the random placement of the vias 104 in FIG. 1. The solid lines 108 for both the first and second layers 100-102 of wires indicate available horizontal and vertical wiring channels. In FIG. 2, fourteen horizontal wiring channels are blocked as indicated by the fourteen dotted lines 106, while thirteen vertical wiring channels are blocked as indicated by the thirteen dotted lines 106.

In FIG. 3, certain ones of the vias 104 have been moved by one wiring channel or by a maximum of two wiring channels in accordance with an embodiment of the invention. Other vias 104 have not moved. The former locations of each of the vias 104 that have moved in FIGS. 1-2 are indicated by a square with a dotted and a solid line going through each of them 104 and by a square with angled lines for the new location of each moved via 104. In FIG. 3, eight vias 104 were moved a distance of one wiring channel, while four vias 104 were moved a distance of two wiring channels, which is the maximum allowed movement according to an embodiment of the invention. Another four vias 104 did not move, as indicated by a solid white square for each of these non-moved vias 104. As a result of the movement of the vias 104 as illustrated in FIG. 3 in accordance with an embodiment of the invention, the number of wiring channels blocked by the vias 104 has now been reduced to from fourteen to six in the horizontal direction as indicated by the corresponding dotted lines 106 in FIG. 3, and from thirteen to seven in the vertical direction also as indicated by the dotted lines 106 (or a total of approximately 50%). In FIG. 3, as in FIGS. 1-2, the solid lines 108 indicate available wiring channels, the number of which increased significantly as illustrated in FIG. 3 due the removal of a number of the blocked wiring channels by way of the via movement described above. That is, a wiring channel can either be blocked or available and, thus, a reduction in the number of blocked wiring channels represents a correspondingly direct increase in the number of available wiring channels.

Figure 4:
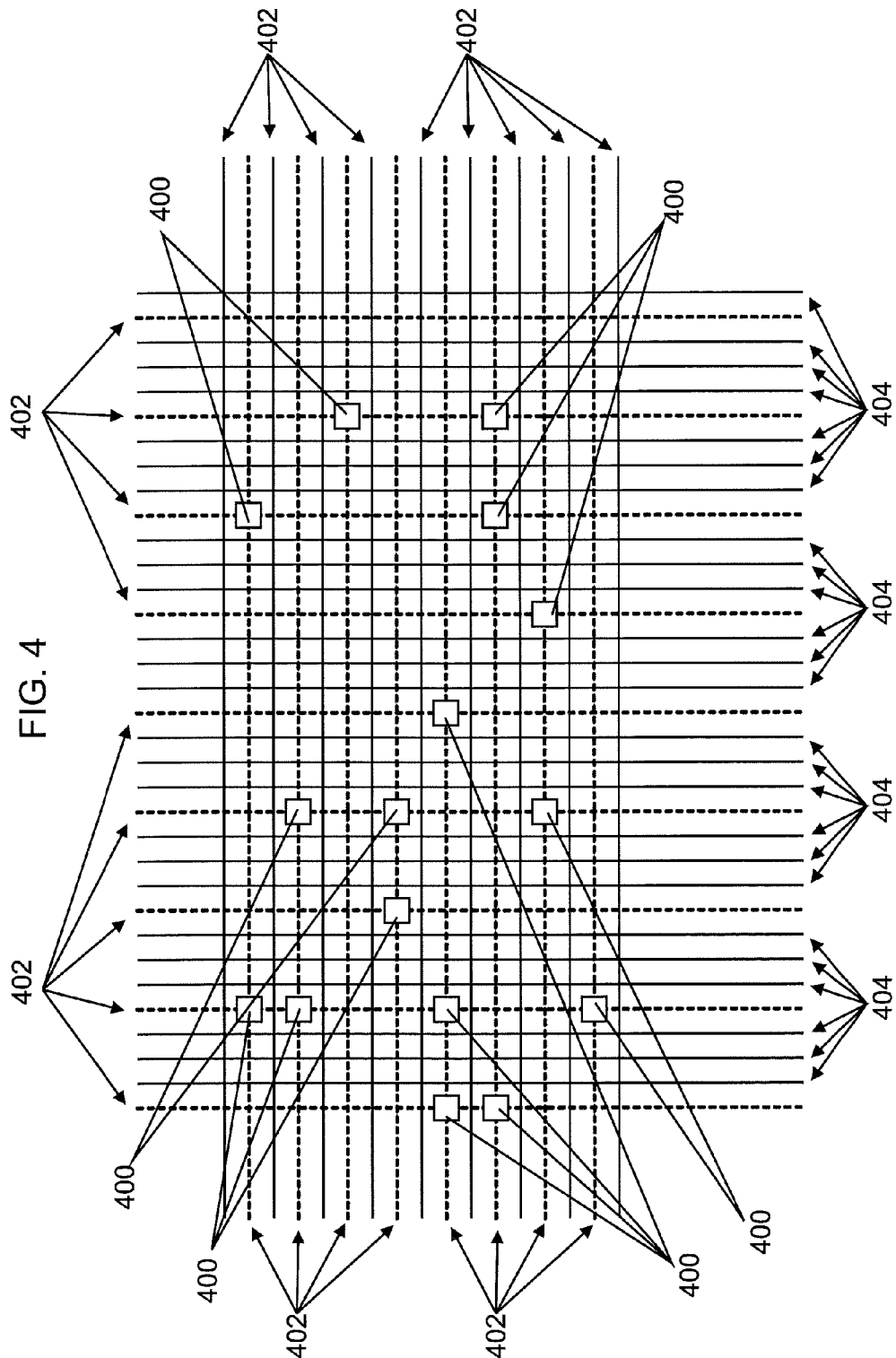
FIG. 4 illustrates another embodiment of the invention in which via placement is restricted to certain constant amounts of both horizontal and vertical spacing between vias and thus between wiring channels.

Referring to FIG. 4, there illustrated is another embodiment of the invention in which allowed via placement is restricted to certain constant amounts of both horizontal and vertical spacing between vias 400 and thus between wiring channels. In FIG. 4 as in FIGS. 2-3, the dotted lines 402 indicate blocked wiring channels and the solid lines 404 indicate available wiring channels. In this embodiment, it can be seen that a via 400 is located in every other horizontal wiring channel—thus, the corresponding horizontal channel spacing is a constant value of two. Also, a via 400 is located in every fourth vertical wiring channel—thus, the corresponding vertical channel spacing is a constant value of four. That is, the allowed via positions are on a pattern of wiring channels on each layer of the IC, wherein the patterns of wiring channels allowed for the vias is given by a constant repetition rate. Also, the repetition rate of the wiring channels with allowed via connections in one of the IC layers may be different from the repetition rate of the allowed wiring channels in another IC layer.

In accordance with the invention, heuristics may be utilized to define the placement of the vias to maximize the number of available wiring channels (i.e., to limit or reduce the number of blocked wiring channels) within a wiring layer within the integrated circuit. In a first heuristic, all wiring channels may be enumerated from left to right in a horizontal direction and also from bottom to top in a vertical direction. Then, integer numbers n for the vertical direction and m for the horizontal direction are chosen such that only vertical and horizontal wiring channels that are divisible by the integers n and m, respectively, result. Thus, "n" and "m" are the resulting vertical and horizontal wiring channel via spacing. In the embodiment of FIG. 4, "n" equals 4 and "m" equals 2. From this heuristic it can be seen that the larger the number that n and m are, the less channels will be blocked by vias. However, the number of required wiring channels and hence the wire length may be increased to reach a valid via position.

In a second heuristic, a global routing of the wiring channels on the IC is generated and areas in which global routing congestion is identified. In those areas with relatively high horizontal congestion, a relatively high vertical channel via spacing is utilized, while in areas with relatively high vertical congestion, a relatively high horizontal channel via spacing is utilized. Local routing is then performed. A third heuristic may involve the re-routing or movement of the positions of the vias of existing routing. This is similar to the movement of the vias 104 in FIG. 3.

Figure 5:
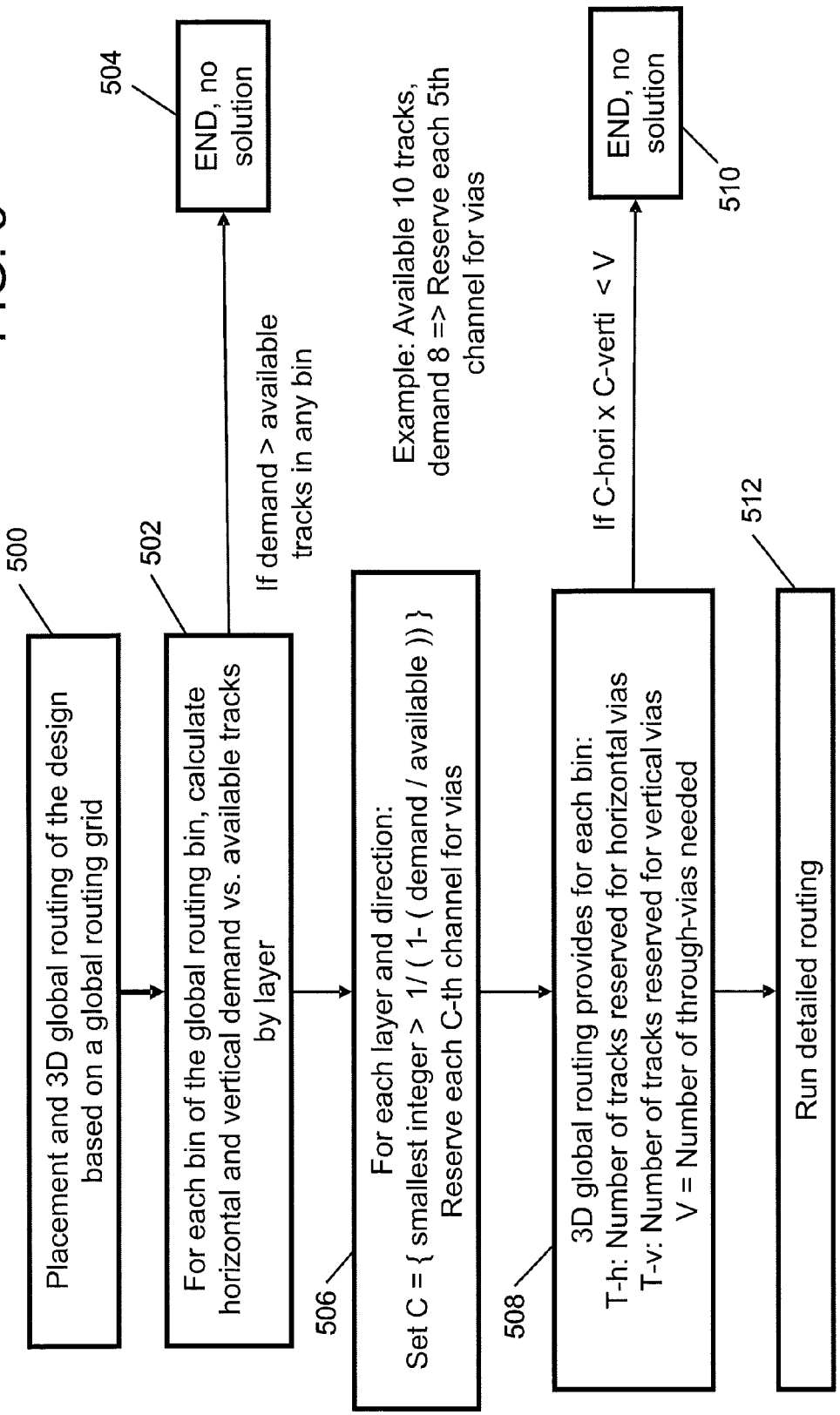
FIG. 5 is a flowchart of a method for routing wiring channels according to an embodiment of the invention.

Referring to FIG. 5, there illustrated is a flowchart of steps in a method embodiment of the invention for placement of vias to maximize the number of available wiring channels and thus minimize the number of blocked wiring channels. In a first step 500, a global routing of the wiring channels on the various layers of an integrated circuit is performed based on a global routing grid. In a step 502, for each bin of the global routing bin, the horizontal and vertical demand for the number of wiring channels is calculated versus the available wiring channels or "tracks". This is done for each layer of the IC.

If the demand for wiring channels exceeds the number of available wiring channels or tracks in any bin, then the method ends in a step 504, as there is no solution for the proper placement of the vias. Instead, if the demand for wiring channels does not exceed the available tracks, then in a step 506 for each layer and direction, the variable "C", which denotes wiring channels, is set as per the following equation:

$$C=\{\text{smallest integer}>1/(1-(\text{demand}/\text{available}))\} \quad \text{Eq. 1}$$

Each C-th wiring channel is reserved for placement of the vias. For example, if there are ten wiring channels or tracks available and the wiring channel demand is eight, then each fifth wiring channel is reserved for placement of vias. In general C is determined by a function f(demand, available) such that f(demand1, available1)>=f(demand2, available2) if demand1/available1>=demand2/available2. In other words, if the demand is higher in one direction, the spacing between the vias in the other direction is increased. In a step 508, a three-dimensional routing is performed for each bin. T-h is the number of wiring channels or tracks reserved for the horizontal vias, while T-v is the number of wiring channels reserved for the vertical vias, and "V" equals the number of through vias needed. If C horizontal (the horizontal spacing) times C vertical (the vertical spacing) is less than V, the method ends in a step 510, as there is no solution for the amount of vias needed. Instead, if C horizontal times C vertical is greater than V, then a step 512 is performed where the detailed routing of the wiring channels on the IC is performed.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 6:
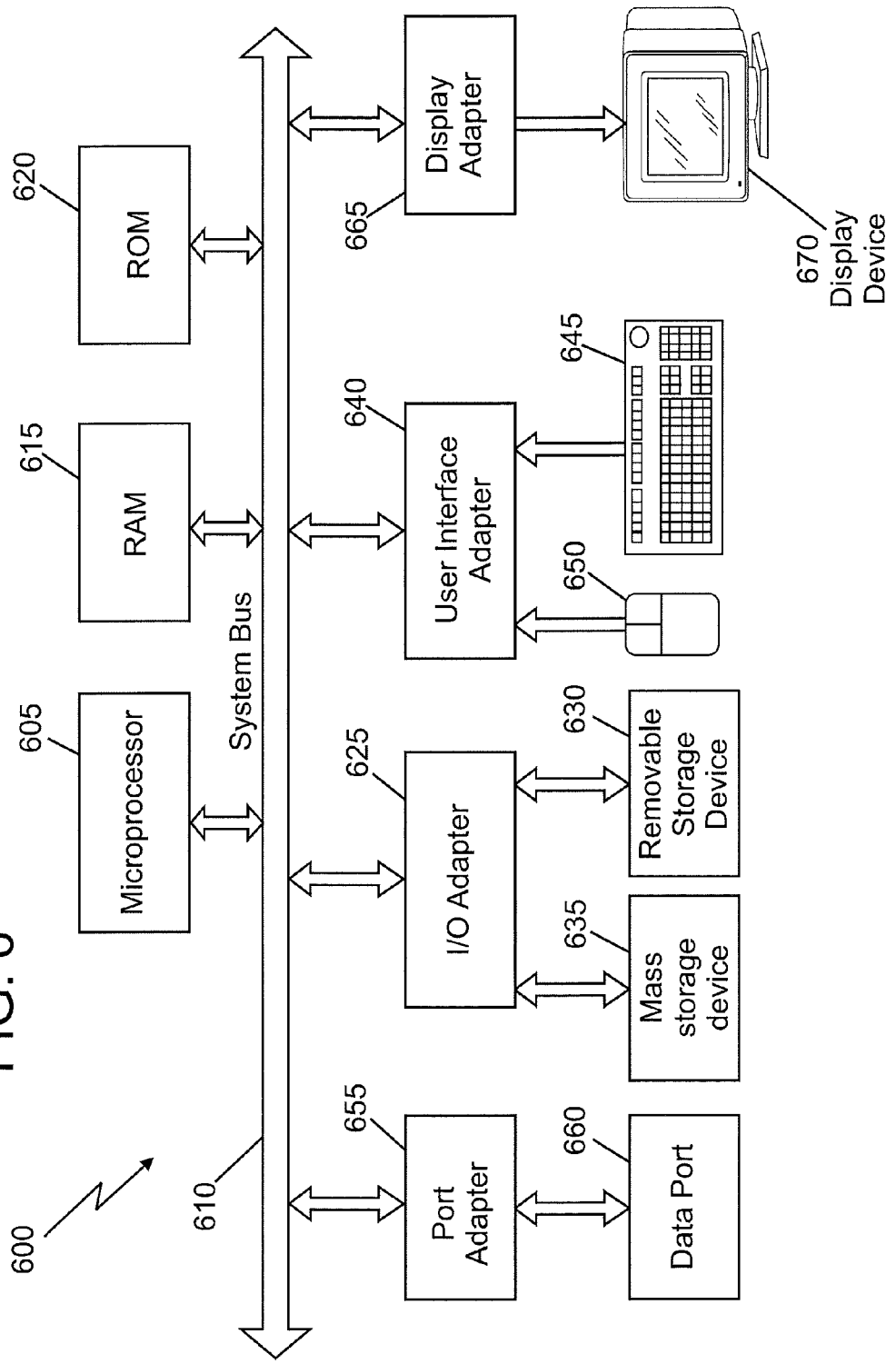
FIG. 6 is a schematic block diagram of a general-purpose computer suitable for practicing embodiments of the present invention.

Generally, the method embodiments disclosed herein may be practiced with a general-purpose computer and the method embodiments may be coded as a set of instructions on removable or hard media for use by the general-purpose computer. FIG. 6 is a schematic block diagram of a general-purpose computer suitable for practicing embodiments of the present invention. In FIG. 6, computer system 600 has at least one microprocessor or central processing unit (CPU) 605. CPU 605 is interconnected via a system bus 610 to a random access memory (RAM) 615, a read-only memory (ROM) 620, an input/output (I/O) adapter 625 for connecting a removable data and/or program storage device 630 and a mass data and/or program storage device 635, a user interface adapter 640 for connecting a keyboard 645 and a mouse 650, a port adapter 655 for connecting a data port 660 and a display adapter 665 for connecting a display device 670.

ROM 620 contains the basic operating system for computer system 600. The operating system may alternatively reside in RAM 615 or elsewhere as is known in the art. Examples of removable data and/or program storage device 630 include magnetic media such as floppy drives and tape drives and optical media such as CD ROM drives. Examples of mass data and/or program storage device 635 include hard disk drives and non-volatile memory such as flash memory. In addition to keyboard 645 and mouse 650, other user input devices such as trackballs, writing tablets, pressure pads, microphones, light pens and position-sensing screen displays may be connected to user interface 640. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 630, fed through data port 660 or typed in using keyboard 645.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the exemplary method described above and illustrated in FIG. 5.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for placing wiring channels and via connections between wiring channels within multiple layers of an integrated circuit, comprising:
   creating a model of the integrated circuit on a computing device;
   placing, in the model on the computing device, a plurality of via connections between wiring channels on a first layer of the integrated circuit and wiring channels on a second layer of the integrated circuit, wherein each of the via connections connect together one wiring channel on the first layer and one wiring channel on the second layer, wherein one of the wiring channels on the first and second layers is blocked if the channel has one of the via connections located along its length and wherein one of the wiring channels is available if the channel does not have one of the via connections located along its length; and
   relocating in the model on the computing device certain one or more of the via connections by no more than some amount of wiring channels to thereby maximize the number of available wiring channels in both the first and second layers; and
   defining one or more areas within the integrated circuit where there exists a global routing congestion condition;
   wherein for each of the one or more areas with a horizontal global routing congestion condition, increasing a spacing between the via connections in a vertical direction when viewing the wiring channels from a top view; and
   wherein for the one or more areas with a vertical global routing congestion condition, increasing a spacing between the via connections in a horizontal direction when viewing the wiring channels from a top view.

2. The method of claim 1, wherein the first and second layers of the integrated circuit are disposed vertically one above the other.

3. The method of claim 1, wherein the wiring channels on the first layer and the wiring channels on the second layer are perpendicular to each other.

4. The method of claim 1, wherein placing a plurality of via connections between wiring channels on a first layer of the integrated circuit and wiring channels on a second layer of the integrated circuit occurs at random.

5. The method of claim 1, wherein placing a plurality of via connections between wiring channels on a first layer of the integrated circuit and wiring channels on a second layer of the integrated circuit places the via connections such that allowed via positions are on a pattern of wiring channels on each layer.

6. The method of claim 5, wherein the pattern of wiring channels allowed for the vias is given by a constant repetition rate.

7. The method of claim 6, wherein the repetition rate of the wiring channels with allowed via connections in the first layer is different from the repetition rate of the wiring channels with allowed via connections in the second layer.

8. A computer program product, comprising:
   a computer-readable storage device for storing a computer program code for implementing a method for placing wiring channels and via connections between wiring channels within multiple layers of an integrated circuit, the computer program code including
   instructions for causing a computer to implement the method, the method comprising:
   placing a plurality of via connections between wiring channels on a first layer of the integrated circuit and wiring channels on a second layer of the integrated circuit, wherein each of the via connections connect together one wiring channel on the first layer and one wiring channel on the second layer, wherein one of the wiring channels on the first and second layers is blocked if the channel has one of the via connections located along its length and wherein one of the wiring channels is available if the channel does not have one of the via connections located along its length;
   relocating certain one or more of the via connections by no more than two wiring channels to thereby maximize the number of available wiring channels in both the first and second layers; and
   defining one or more areas within the integrated circuit where there exists a global routing congestion condition;
   wherein for each of the one or more areas with a horizontal global routing congestion condition, increasing a spacing between the via connections in a vertical direction when viewing the wiring channels from a top view; and
   wherein for the one or more areas with a vertical global routing congestion condition, increasing a spacing between the via connections in a horizontal direction when viewing the wiring channels from a top view.

9. The computer program product of claim 8, wherein the first and second layers of the integrated circuit are disposed vertically one above the other.

10. The computer program product of claim 8, wherein the wiring channels on the first layer and the wiring channels on the second layer are located perpendicular to each other.

11. The computer program product of claim 8, wherein placing a plurality of via connections between wiring channels on a first layer of the integrated circuit and wiring channels on a second layer of the integrated circuit occurs at random.

12. The computer program product of claim 8, wherein placing a plurality of via connections between wiring channels on a first layer of the integrated circuit and wiring channels on a second layer of the integrated circuit places the via connections such that allowed via positions are on a pattern of wiring channels on each layer.

13. The computer program product of claim 12, wherein the pattern of wiring channels for the vias is given by a constant repetition rate.

14. The computer program product of claim 13, wherein the repetition rate of the wiring channels with allowed via connections in the first layer is different from the repetition rate of the wiring channels with allowed via connections in the second layer.

15. A system for implementing the placement of wiring channels and via connections between wiring channels within multiple layers of an integrated circuit, comprising:
   a computing network including a processing device in communication with one or more computer memory storage devices; and
   the computing network further configured to implement a method for placing wiring channels and via connections between wiring channels within multiple layers of an integrated circuit, the method further comprising:
   placing a plurality of via connections between wiring channels on a first layer of the integrated circuit and wiring channels on a second layer of the integrated circuit, wherein each of the via connections connect together one wiring channel on the first layer and one wiring channel on the second layer, wherein one of the wiring channels on the first and second layers is blocked if the channel has one of the via connections located along its length and wherein one of the wiring channels is available if the channel does not have one of the via connections located along its length;

relocating certain one or more of the via connections by no more than two wiring channels to thereby maximize the number of available wiring channels in both the first and second layers; and defining one or more areas within the integrated circuit where there exists a global routing congestion condition;

wherein for each of the one or more areas with a horizontal global routing congestion condition, increasing a spacing between the via connections in a vertical direction when viewing the wiring channels from a top view;

wherein for the one or more areas with a vertical global routing congestion condition, increasing a spacing between the via connections in a horizontal direction when viewing the wiring channels from a top view.

16. The system of claim 15, wherein the first and second layers of the integrated circuit are disposed vertically one above the other.

17. The system of claim 15, wherein the wiring channels on the first layer and the wiring channels on the second layer are located perpendicular to each other.

18. The system of claim 15, wherein placing a plurality of via connections between wiring channels on a first layer of the integrated circuit and wiring channels on a second layer of the integrated circuit occurs at random.

19. The system of claim 15, wherein placing a plurality of via connections between wiring channels on a first layer of the integrated circuit and wiring channels on a second layer of the integrated circuit places the via connections such that allowed via positions are on a pattern of wiring channels on each layer.

20. The system of claim 19, wherein the pattern of wiring channels allowed for the vias is given by a constant repetition rate.

21. The system of claim 20, wherein the repetition rate of the wiring channels with allowed via connections in the first layer is different from the repetition rate of the wiring channels with allowed via connections in the second layer.

* * * * *